US006985006B2

(12) United States Patent
Udupa et al.

(10) Patent No.: US 6,985,006 B2
(45) Date of Patent: Jan. 10, 2006

(54) ADJUSTING THE STRENGTH OF OUTPUT BUFFERS

(75) Inventors: Anand Hariraj Udupa, Bangalore (IN); Visvesvaraya Pentakota Appala, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 160 days.

(21) Appl. No.: 10/397,421

(22) Filed: Mar. 27, 2003

(65) Prior Publication Data

US 2004/0191976 A1 Sep. 30, 2004

(51) Int. Cl.
*H03K 19/0948* (2006.01)

(52) U.S. Cl. ............................ 326/30; 326/32; 326/34; 326/87

(58) Field of Classification Search ............ 326/26–27, 326/30–34, 87, 90
See application file for complete search history.

(56) References Cited

U.S. PATENT DOCUMENTS 5,621,335 A * 4/1997 Andresen .................... 326/30
6,486,698 B2 * 11/2002 Yanagawa .................... 326/30

* cited by examiner

*Primary Examiner*—Anh Q. Tran
(74) *Attorney, Agent, or Firm*—W. Daniel Swayze, Jr.; W. James Brady; Frederick J. Telecky, Jr.

(57) ABSTRACT

The rate at which the output of an output buffer changes is determined, and the strength of the output buffer is modified until the rate of change reaches a desired rate. The desired rate may be selected such that strength of the output buffer matches the then existing load. In other words, the strength may be only as much as needed to drive the then existing load. As a result, effects such as switching noise may be considerably reduced.

28 Claims, 6 Drawing Sheets

ADJUSTING THE STRENGTH OF OUTPUT BUFFERS

BACKGROUND OF THE INVENTION

1. Field of the Invention

The present invention relates to integrated circuits, and more specifically to a method and apparatus for adjusting the strength of output buffers.

2. Related Art

Output buffers are often used in integrated circuits to drive external device/load (e.g., another integrated circuit) based on data received from another source. In general, output buffers need to drive external loads with sufficient strength (e.g., the amount of current) to ensure that the data is accurately transferred to the external devices within a pre-specified time duration.

The desired strength of output buffers depends on several factors. Some of such factors include manufacturing process, supply voltage, temperature, speed and external load. Some of the relevant factors may change while an integrated circuit is in use/operation, thereby further changing the load (desired strength) and/or the strength of the output buffer.

Output buffers are often designed with a high strength corresponding to a worst case scenario, for example, weak/slow manufacturing process, maximum ambient temperature, maximum load, and maximum speed of operation. As a result, such an output buffer can drive the external load for any combination of the factors.

One problem often encountered with such output buffers designed for worst case is an undesirable amount of switching noise. Switching noise generally refers to undesirable noise generated due to the transition of the signal at the output node of an output buffer. In addition, a buffer designed for worst case may switch faster than required, which may cause more switching noise.

Such a switching noise is often propagated to other components/parts of an integrated circuit through a common substrate. Switching noise is generally undesirable at least in that undesirable interference may be presented to signals in the surrounding components. At least due to such a reason(s), it may be desirable to adjust the strength of an output buffer.

SUMMARY OF THE INVENTION

An aspect of the present invention enables the strength of an output buffer to be adjusted such that the load is driven with optimal strength. In an embodiment, the rate at which an output of an output buffer changes in response to receiving a transition, is determined. The strength of the output buffer is changed until the rate equals a desired rate. By setting the desired rate to a fixed value, the output buffer can operate while driving the load with the appropriate strength irrespective of changes in the load and/or variables (e.g., power supply) which affect the strength of the output buffer.

In one embodiment, the strength of the output buffer is changed by using multiple inverters (with each inverter containing a NMOS transistor and a PMOS transistor). The strength with reference to rising edges (i.e., transition from 0 to 1) is controlled by selectively enabling only some of the PMOS transistors. The strength with reference to falling edges is controlled by selectively enabling only some of the NMOS transistors. In general, the strength is controlled due to the effective W/L (width/length) of the enabled transistors.

In an alternative embodiment, a single pair of NMOS and PMOS transistors may be used. The strength with respect to falling and rising edges may be respectively controlled by changing the $V_{GS}$ (voltage across gate terminal and source terminal). The alternative embodiment may provide more (fine) control in comparison to the previous embodiment as the control is performed in analog form.

According to another aspect of the present invention, two voltage comparators may respectively be used to compare the output of an output buffer with a high voltage and a low voltage respectively. The result of comparison (as related to low voltage in case of a transition from 1 to 0, and as related to high voltage in case of a transition from 0 to 1) may be examined some time ("fixed delay") after the transition.

A control block may receive the results of the comparisons (generated after the fixed delay), and generate control signals to selectively enable/disable the NMOS transistors and the PMOS transistors in the case of the embodiment with multiple inverters. Similarly, the control block may control $V_{GS}$ of the transistors in the case of the alternative embodiment noted above.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the following accompanying drawings.

DETAILED DESCRIPTION OF THE PREFERRED EMBODIMENTS

1. Overview

An aspect of the present invention determines whether the rate of change from one logical value to another logical value at an output is more or less than a desired speed, and adjusts the strength of the output buffer to attain the desired rate of change. As the rate of change generally has a relationship to the amount of load offered, the output buffer can be operated at only the necessary strength (to drive the load offered at that time) by choosing the desired rate to correspond to the desired strength of the output buffer.

As the output buffer drives the load only at a necessary strength, effects such as switching noise may be reduced considerably as compared to a case in which the strength of an output buffer is determined by worst-case conditions.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Environment

Figure 1:
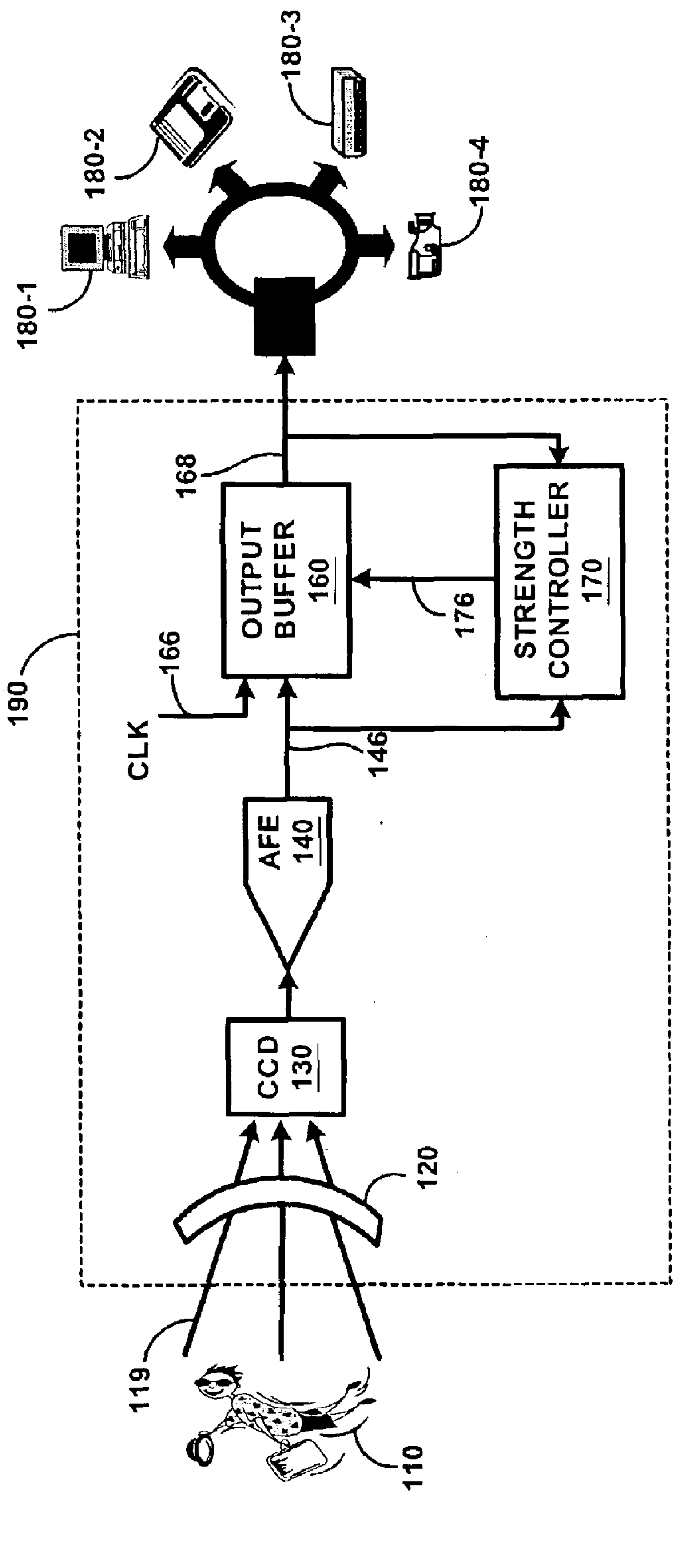
FIG. 1 is a block diagram illustrating an example device in which the present invention can be implemented.

FIG. 1 is a block diagram illustrating an example environment in which the present invention can be implemented. Light 119 is shown from image 110 being allowed to pass to device 190 (such as a digital camera or a scanner). Device 190 generates pixel data elements representing image 110. The pixel data elements may be forwarded on path 168, and used in several ways, for example, viewed/edited by computer system 180-1, stored in floppy disk 180-2, printed on printer 180-3 or transferred to video player 180-4.

Device 190 is shown containing lens 120, CCD (Charge Coupled Device) 130, analog front end (AFE) 140, output buffer 160 and strength controller 170. Each component is described below.

Light 119 from image 110 is shown being focused on CCD 130 by lens 120. CCD 130 contains several pixels which are charged proportionate to the product of the intensity of the incident light and the time of exposure to the light. The charge is converted into voltage in a known way and transferred to AFE 140. CCD 130 is an example embodiment of an image sensor.

AFE 140 may employ techniques such as correlated double sampling (which are well known in the relevant arts) to generate a voltage level corresponding to each pixel processed by AFE 140. AFE 140 may then sample the voltages to generate the digital values (on path 146) representing the image. In general, AFE 140 represents a data source (internal to device 190), which provides digital values to output buffer 160. However, the data source can be a different component depending on the type of device.

Output buffer 160 receives the data on input path 146 at time points specified by clock signal received on path 166, and drives an external load (present on output path 168) to transmit the received data to one of the external devices. Strength controller 170 adjusts the strength of output buffer to a desired value by providing the appropriate control signals on path 176. The manner in which such adjustment can be made is described below with several examples.

3. Method

Figure 2:
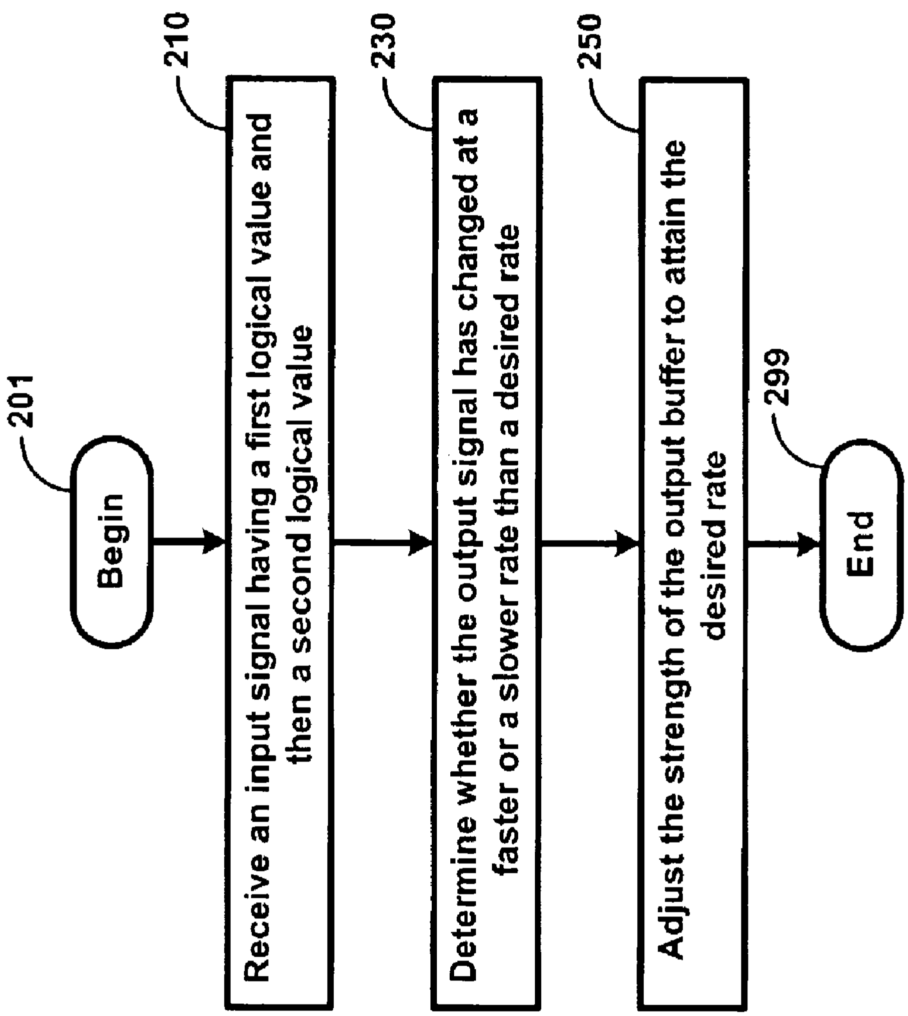
FIG. 2 is a flowchart illustrating the details of a method using which the strength of an output buffer may be adjusted according to an aspect of the present invention.

FIG. 2 is a flowchart illustrating the details of a method using which the strength of an output buffer may be adjusted according to an aspect of the present invention. For illustration, the method is described with reference to FIG. 1. However, the method can be implemented in several other embodiments as will be apparent to one skilled in the relevant art based on the disclosure provided herein. Such embodiments are also contemplated to be within the scope and spirit of the present invention. The method begins in step 201 in which control passes to step 210.

In step 210, output buffer 160 receives an input signal having a first logical value and then a second logical value, representing an input transition. For example, if the first logical value is logic '0' and second logical value is '1', then the input transition represents a rising edge and if the first logical value is logic '1' and second logical value is '0', then the input transition represents a falling edge. Output buffer 160 provides an output signal on path 168 representing an output transition generated in response to the input transition.

In step 230, strength controller 170 determines whether the output signal has changed at a faster or a slower rate than a desired rate. The desired rate may be determined based on various specifications relating to the desired operational characteristics of buffer 160.

In step 250, strength controller 170 adjusts the strength of output buffer 160 to attain the desired rate. Assuming for illustration that the output transition represents a rising edge, if the output signal is changing faster, then the strength of output buffer 160 is reduced, else if the output signal is changing slower, then the strength of output buffer 160 is increased to attain the desired rate of change for transitions.

As the rate of change depends on the load presented on path 168, an output buffer can be made to drive a load only at a necessary strength by ensuring that the output buffer drives the load to cause transitions at only a desired rate of change. The manner in which strength controller 170 may determine whether the output signal has changed faster or slower is described first. The manner in which the strength of output buffer 160 may be adjusted is described next.

4. Strength Controller

Figure 3:
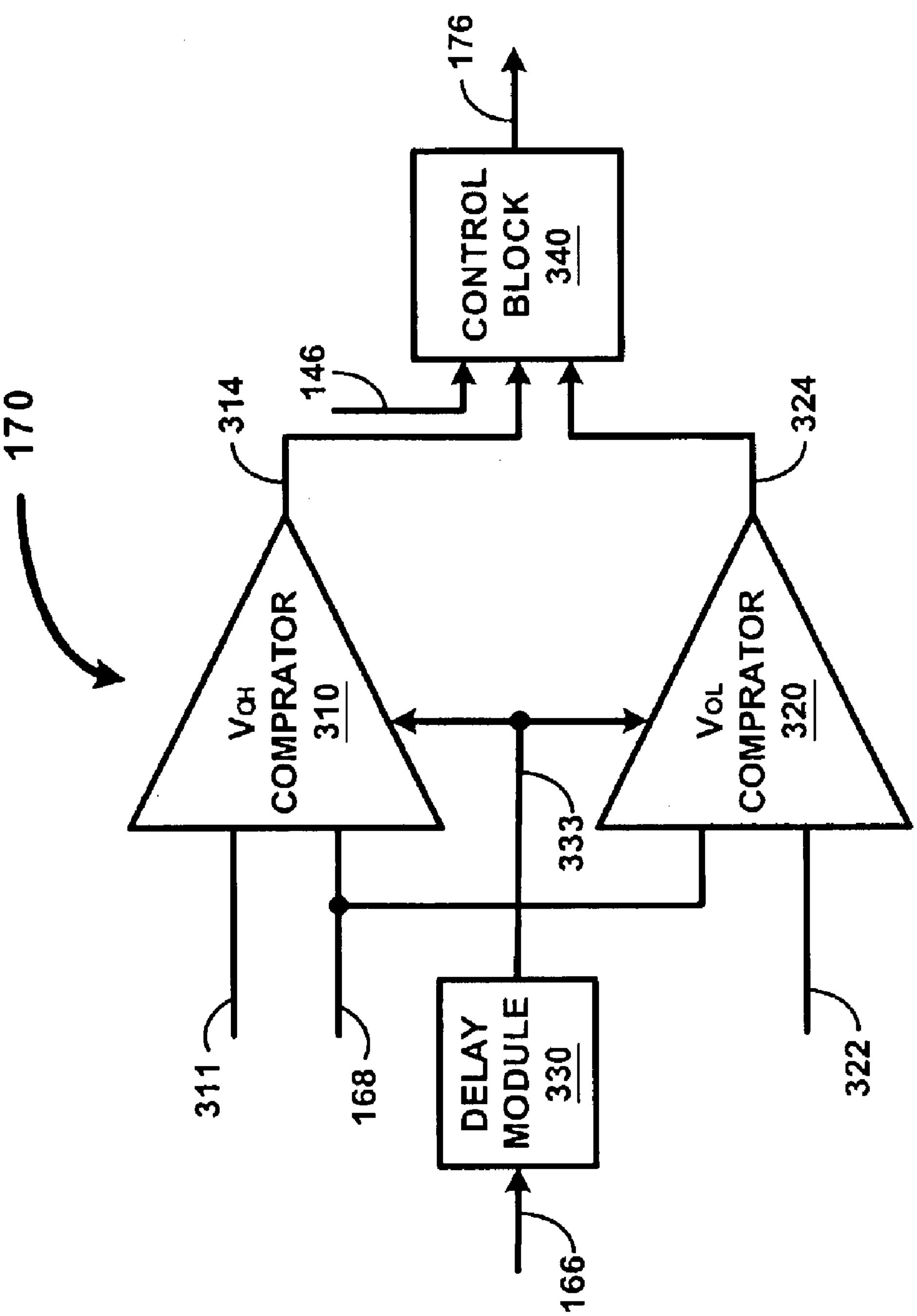
FIG. 3 is a block diagram illustrating the details of a strength controller in an embodiment of the present invention.

FIG. 3 is a block diagram illustrating the details of strength controller 170 in an embodiment of the present invention. Strength controller 170 is shown containing $V_{OH}$ comparator 310, $V_{OL}$ comparator 320, delay module 330 and control block 340. Each component is described below.

Delay module 330 generates a delayed version of clk signal received on path 166 and provides the delayed signal 'clkd' on path 333. The extent of delay may be determined by the desired rate with which the output signal of output buffer 160 on path 168 may need to change in response to a change in input signal on path 146.

$V_{OH}$ comparator 310 compares the voltage level of output signal on path 168 with a high threshold voltage ($V_{OH}$) received on path 311, and generates a corresponding result on path 314. The comparison may be performed at a time point specified by clkd received on path 333. $V_{OH}$ generally represents a high voltage level which is used as a basis to determine the rate of change of the output signal when the output signal is transitioning from 0 to 1. In an embodiment, $V_{OH}$ approximately equals the voltage level representing 1.

As may be appreciated, by choosing an appropriate voltage level for $V_{OH}$ and/or by controlling the delay introduced by delay module 330, the result of comparison may be made to indicate whether the output signal on path 168 is rising faster and slower than at a desired rate. In general, the desired rate is to be chosen such that the transition occurs slowly, but reaches a desired steady state voltage within design requirements.

$V_{OL}$ comparator 320 similarly generates a signal on path 324 indicating whether the output signal on path 168 is falling slower or faster than a desired rate. The signal on path 324 is generated by comparing the output signal on path 168 with a low threshold voltage ($V_{OL}$) received on path 322 at the time point specified by clkd received on path 333. $V_{OL}$ generally represents a low voltage level which is used as a basis to determine the rate of change of the output signal when the output signal is transitioning from 1 to 0. In an embodiment, $V_{OL}$ approximately equals the voltage level representing 0.

Control block 340 generates control signals (on path 176) which indicate whether to increase or decrease the strength of output buffer 160. Adjustment to the strength of output buffer 160 with respect to rising edges is made based on results received on path 314, and adjustment with respect to falling edges is made based on results received on path 324. The determination of presence of a transition and whether the transition represents a rising or a falling transition, may be made by using an internal memory to store a previous input value received on path 146 and comparing a present value also received on path 146.

In an embodiment, control block 340 causes changes to strength (of output buffer 160) with respect to rising edges based on the results received on path 314, and with respect to falling edges based on the results received on path 324. For example, if a result on path 314 represents a 'greater than' value, control block 314 may send a control signal on path 176 to decrease the strength of output buffer 160 corresponding to rise time, else sends a control signal to increase the strength. Similarly, the strength with respect to fall time may be changed based on the results received on path 324 (in the case of a falling edge). If there is no transition in the input signal, no adjustment may be made to both rise time or fall time.

The adjustment to the strength of output buffer 160 may be accomplished using several approaches. In general, the implementation of control block 340 needs to be consistent with the implementation of output buffer 160 for such adjustments. Some example approaches implementing the adjustment are described below. It is helpful to understand the theoretical basis to understand the approaches in detail, and accordingly the theoretical basis is described first.

5. Theoretical Basis

In one embodiment, output buffer 160 is implemented as multiple stages of inverters connected in series, with each inverter being implemented as a combination of PMOS and NMOS transistors. The strength of output buffer 160, which is the amount of current ($I_{ds}$) supplied by PMOS and NMOS transistors is given by equation (1).

$$I_{ds} \propto W/L*(|V_{GS}|-|V_t|)^2 \qquad \text{Equation (1)}$$

wherein 'W' and 'L' respectively represent the width and length of the transistors, $V_{GS}$ represents the gate to source bias voltage and $V_t$ is a threshold voltage, '| |' represents a modulus operator (absolute value), and '∝' represents proportional logical relationship.

It may be observed from equation (1) that the strength of output buffer 160 can be adjusted by either changing W/L or $V_{GS}$. The strength of a PMOS transistor can be changed to adjust the rise time and the strength of NMOS transistor can be changed to adjust the fall time. The manner in which W/L can be adjusted is described first with reference to FIGS. 4A and 4B, and the manner in which $V_{GS}$ can be adjusted to adjust the strength of output buffer 160 is described later with reference to FIG. 5.

6. Adjusting the Strength of Output Buffer by Changing W/L

Figure 4A:
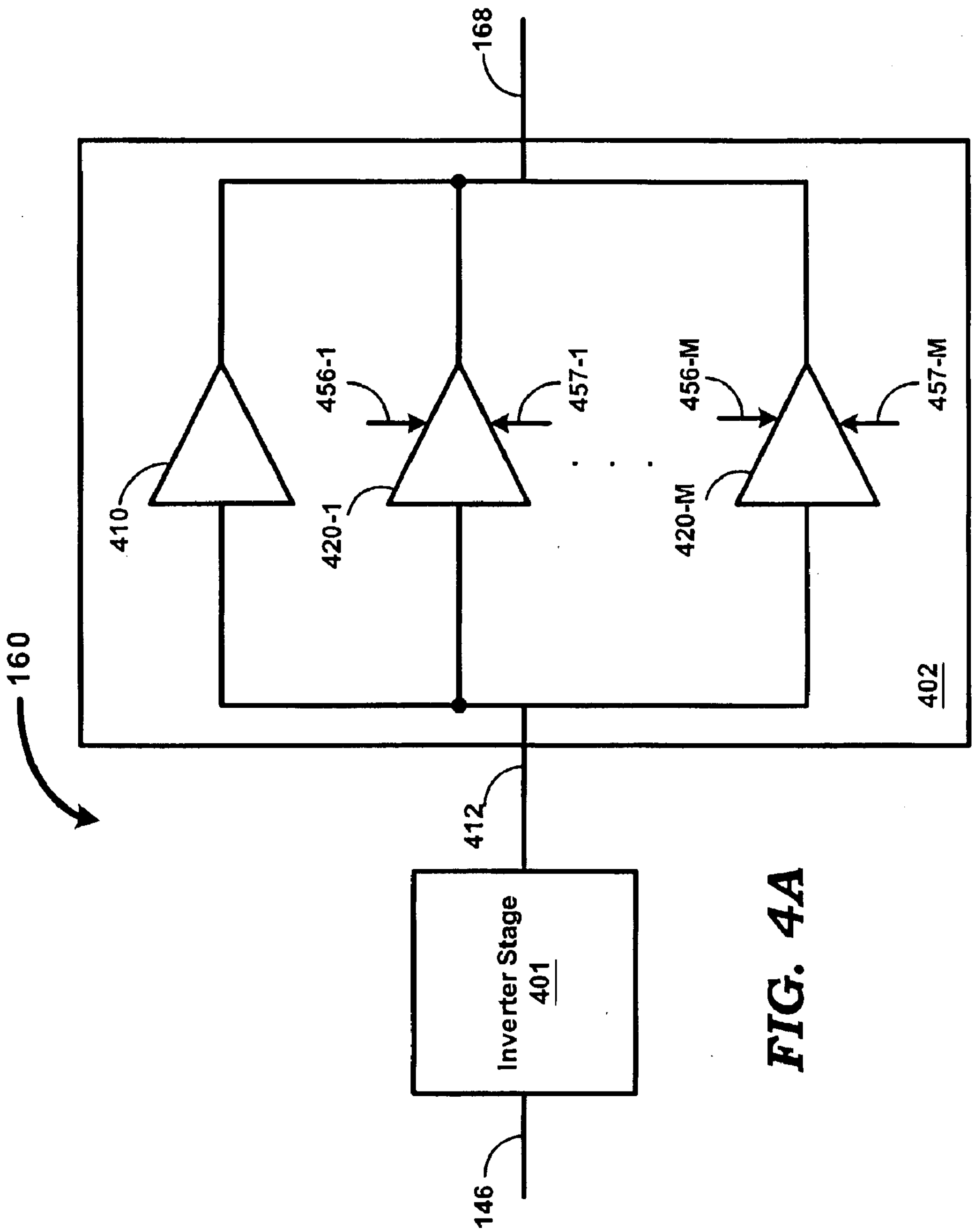
FIG. 4A is a block diagram illustrating the manner in which the strength of an output buffer may be adjusted by changing W/L of transistors in an embodiment of the present invention.
Figure 4B:
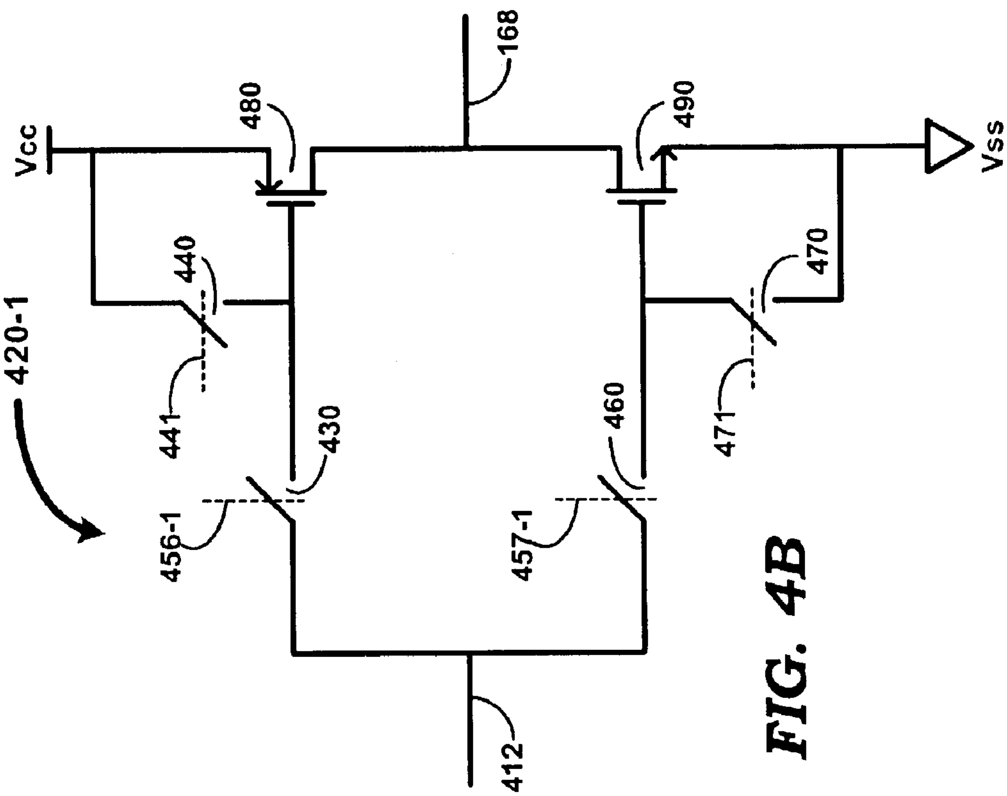
FIG. 4B is a circuit diagram illustrating the details of an inverter used for changing W/L of an output buffer in an embodiment of the present invention.

FIGS. 4A and 4B are diagrams together illustrating the details of adjusting the strength of output buffer 160 by adjusting W/L in an embodiment of the present invention. FIG. 4A is illustrating the details of output buffer 160, which is shown containing two inverter stages 401 and 402 for illustration. However, output buffer 160 may contain several more inverter stages as is well known in relevant arts. In an embodiment of the present invention, the strength of an output buffer is adjusted by adjusting the strength of final inverter stage. In such an embodiment, the strength of output buffer 160 is adjusted by changing W/L of final inverter stage 402.

Inverter stage 401 receives input signal on path 146 and provides the inverted input signal on path 412. Inverter stage 402 further inverts the inverted input signal received on path 412 and provides the output on path 168, which is similar to the input signal received on path 146. The manner in which inverter stage 402 can be implemented to adjust the strength of output buffer 160 by changing W/L value is described below.

Broadly, inverter stage 402 may be implemented in the form of multiple fingers connected in parallel, with each finger in turn containing an inverter. Each inverter in turn may contain a NMOS transistor and a PMOS transistor. Each of the NMOS and PMOS transistors may be enabled or disabled independently in each inverter. If a PMOS transistor is enabled, it adds to the strength of the output buffer with respect to rise time. If a NMOS transistor is enabled, it adds to the strength of the output buffer with respect to fall time. If neither transistor is enabled, the inverter may not affect the strength of the output buffer. FIGS. 4A and 4B together illustrate such a principle in an embodiment as described below.

FIG. 4A is shown containing inverter stage 402 with 'M+1' inverters 410, and 420-1 through 420-M. The W/L value of inverters 420-1 through 420-M may be changed to adjust the strength of output buffer 160. Inverters 420-1 through 420-M receive ctrlp-1 through ctrlp-M signals on paths 456-1 through 456-M respectively. Similarly, inverters 420-1 through 420-M respectively receive ctrln-1 through ctrln-M signals on paths 457-1 through 457-M. Paths 456-1 through 456-M and 457-1 through 457-M may be contained in path 176.

Inverter 410 ensures a minimum amount of strength for output buffer 160 during both rising and falling edges (as neither NMOS transistor nor PMOS transistor is shown with the ability to be disabled). As described below with reference to FIG. 4B, each of the remaining inverters 420-1 through 420-M can be operated to add to the strength during a rising edge, a falling edge, both edges or none.

FIG. 4B is a circuit diagram illustrating the details of an embodiment of inverter 420-1, which may be activated/deactivated using the signals ctrlp-1 456-1 and ctrln-1 457-1. While the description is provided with respect to inverter 420-1 for illustration, the approaches can be applied to remaining inverters 420-2 through 420-M as well. Inverter 420-1 is shown containing switches 430, 440, 460, and 470, PMOS transistor 480 and NMOS transistor 490. Each component is described below.

Switch 430 is shown controlled by ctrlp-1 456-1 and switch 440 is controlled by an inverted signal of ctrlp-1 456-1 on path 441. Similarly, switch 460 is shown controlled by ctrln-1 457-1, and switch 470 is controlled by an inverted signal of ctrln-1 457-1 on path 471.

PMOS transistor 480, when enabled, adds to the strength of output buffer 160 during rise time. PMOS transistor 480 is enabled when switch 440 is open. Switch 440 is open when ctrlp-1 456-1 is at a logical 1. Thus, the W/L of PMOS transistor 480 adds to the (W/L) factor for the rise time (or during rising edge) when ctrlp-1 456-1 is set to 1.

NMOS transistor 490, when enabled, adds to the strength of output buffer 160 during fall time. NMOS transistor 490 is enabled when switch 470 is open. Switch 470 is open when ctrln-1 457-1 is at a logical 1. Thus, the W/L of NMOS transistor 490 adds to the (W/L) factor for the fall time (or during falling edge) when ctrln-l 457-1 is set to 1. When 456-1 and 457-1 are at logical 0, inverter 420-1 may not affect the strength of output buffer 160 during either fall time or rising time.

From the above, it may be appreciated that each of the PMOS and NMOS transistors needs to be designed with desired W/L values, and control block 340 needs to send appropriate values on lines 456-1 through 456-M to achieve a desired strength during rising edge, and on lines 457-1 through 457-M to achieve a desired strength during falling edge.

In an embodiment, inverters 420-1 through 420-M may respectively have W/L of binary weighted (1, 2, 4, . . . , $2^{M-1}$) units, and control block 340 may provide appropriate values on lines 456-1 through 456-M and 457-1 through 457-M to achieve a desired strength with respect to rise time and fall time. For example, the effective value represented by lines 456-1 through 456-M may be incremented by 1 in response to receiving a 'greater than' result on path 314 for a rising edge, and decremented by 1 otherwise. Alternatively, approaches which react slower/faster to the results generated by comparators 310 and 320 may be implemented.

One problem with the approach of above is that changes to W/L can occur only in discrete steps, which generally implies that a precise strength (of an output buffer) may be hard to achieve. An alternative embodiment which provides more precise control of the buffer strength is described below with reference to FIG. 5.

7. Adjusting the Strength of Output Buffer While Changing $V_{GS}$

Figure 5:
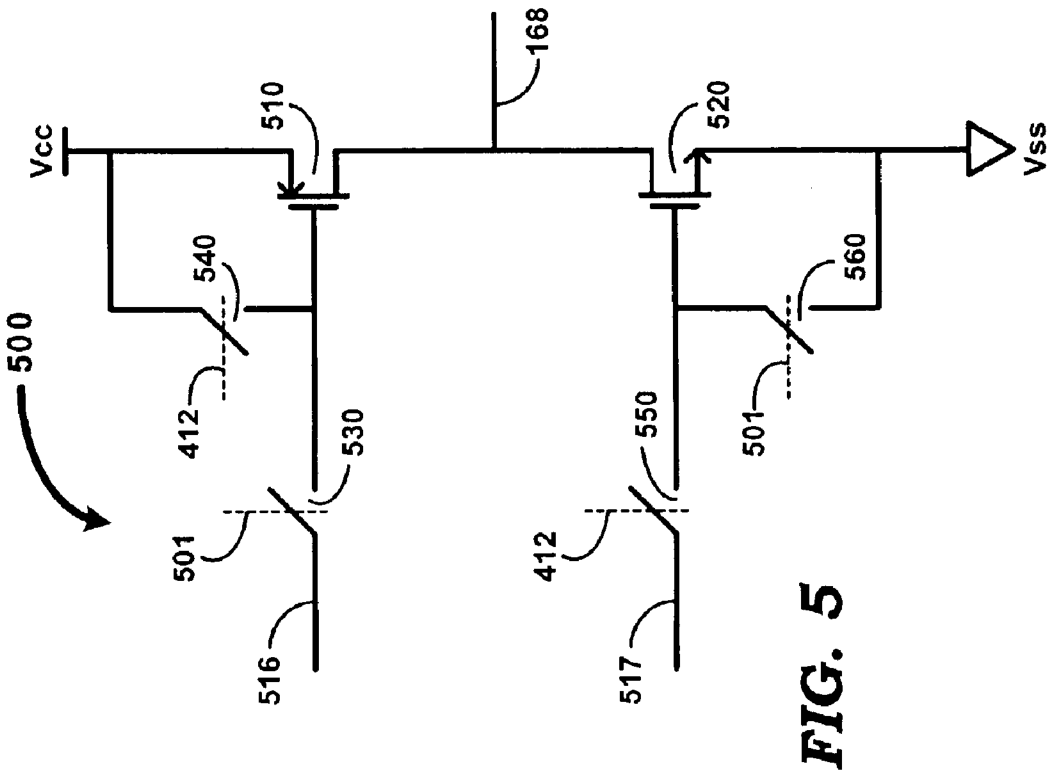
FIG. 5 is a circuit diagram illustrating the manner in which the strength of an output buffer can be adjusted by changing $V_{GS}$ of transistors in an embodiment of the present invention.

FIG. 5 is a circuit diagram illustrating the details of an embodiment of inverter stage 500 of output buffer 160, the strength of which can be adjusted by changing $V_{GS}$ of transistors. $V_{GS}$ is respectively referred to as BIASN and BIASP in the case of NMOS transistors and PMOS transistors.

Merely for illustration, inverter stage 500 is described as operating in conjunction with stage 401 (similar to stage 402 of FIG. 4B). Inverter stage 500 is shown containing PMOS transistor 510, NMOS transistor 520, and switches 530, 540, 550, and 560. Each component is described below.

Switches 540 and 550 are controlled by the signal received on path 412 and switches 530 and 560 are controlled by an inverted version of the signal on path 412 received on path 501. Inverter stage 500 receives the signals representing bias voltages BIASP and BIASN on paths 516 and 517 corresponding to rise time and fall time adjustments respectively. The strength of output buffer 160 may be adjusted by increasing or decreasing bias voltages on paths 516 or 517 as described below.

With reference to adjusting the rise time, the bias voltage BIASP on path 516 is applied to PMOS transistor 510 depending on signal 412. If signal 412 is logic '1', then switch 540 closes and switch 530 opens, which causes gate of transistor 510 to connect to $V_{DD}$ causing transistor 510 to turn off. If signal 412 is logic '0', then the signal on path 501 would be at logic '1', which causes switch 540 to open and switch 530 to close and thus the bias voltage BIASP on path 516 causes transistor 510 to turn on. Therefore, the rise time of output signal on path 168 can be adjusted to the desired rate by changing the bias voltage BIASP on path 516.

Similarly, with reference to adjusting the fall time, the bias voltage BIASN on path 517 is applied to NMOS transistor 520 depending on signal 412. If signal 412 is logic '0', then switch 550 opens and switch 560 closes, which causes the gate terminal of transistor 520 to connect to $V_{SS}$ causing transistor 520 to turn off. If signal 412 is at logic '1', then the signal on path 501 would be at logic '0', which causes switch 560 to open and switch 550 to close and thus the bias voltage BIASN on path 517 causes transistor 520 to turn on. Therefore, the fall time of output signal on path 168 can be adjusted to the desired rate by changing the bias voltage BIASN on path 517.

For example, if signal 412 is at logic '0', which turns on transistor 510 and turns off transistor 520 and thus provides a logic '1' on path 168. However, the transition time of output signal on path 168 in the two cases depends on the value of bias voltages (BIASP and BIASN) on paths 516 and 51 7 respectively. Therefore, the strength of output buffer 160 may be adjusted by changing the bias voltages BIASP and BIASN.

Accordingly, control block 340 may be designed to generate (control) BIASP and BIASN on paths 516 and 517 (contained in path 176 in such an embodiment). Control block 340 may employ various approaches in increasing/decreasing bias voltages based on the results of comparisons received from comparators 310 and 320. Thus, the strength of output buffer 160 may be adjusted in fine granularity as the bias voltages can in turn be changed by fine granularity. Thus, a desired strength may be attained precisely for an output buffer using the approach(es) of FIG. 5.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of adjusting a strength of an output buffer driving a load, said method comprising:

determining a rate at which an output of said output buffer changes in response to receiving a transition on an input of said output buffer; and changing said strength of said output buffer until said rate equals a desired rate in response to receiving additional transitions on said input.

2. The method of claim 1, wherein said transition comprises either from logical 0 to logical 1 or from logical 1 to logical 0.

3. A method of adjusting a strength of an output buffer driving a load, said method comprising:

determining a rate at which an output of said output buffer changes in response to receiving a transition on an input of said output buffer; and changing said strength of said output buffer until said rate equals a desired rate in response to receiving additional transitions on said input, wherein said output buffer comprises a plurality of inverters connected in parallel, wherein each of said plurality of inverters comprises a PMOS transistor and a NMOS transistor, wherein said changing comprises:

determining a first set of PMOS transistors which are to be enabled to achieve said desired rate when said transition is from logical 0 to logical 1, wherein said first set of PMOS transistors being comprised in said plurality of inverters;

determining a first set of NMOS transistors which are to be enabled to achieve said desired rate when said transition is from logical 1 to logical 0, wherein said first set of NMOS transistors being comprised in said plurality of inverters; and enabling said first set of PMOS transistors and said first set of NMOS transistors, wherein said enabling causes a W/L to be controlled to achieve said desired rate with respect to both of said logical 1 to logical 0, and logical 0 to logical 1 transitions.

4. A method of adjusting a strength of an output buffer driving a load, said method comprising:

determining a rate at which an output of said output buffer changes in response to receiving a transition on an input of said output buffer; and changing said strength of said output buffer until said rate equals a desired rate in response to receiving additional transitions on said input, wherein said output buffer comprises a PMOS transistor and a NMOS transistor, wherein said changing comprises:

modifying a $V_{GS}$ voltage associated with said PMOS transistor to control said desired rate with respect to said transition from logical 0 to logical 1; and modifying a $V_{GS}$ voltage associated with said NMOS transistor to control said desired rate with respect to said transition from logical 1 to logical 0.

5. A method of adjusting a strength of an output buffer driving a load, said method comprising:

determining a rate at which an output of said output buffer changes in response to receiving a transition on an input of said output buffer; and changing said strenght of said output buffer until said rate equals a desired rate in response to receiving additional transitions on said input, wherein said determining comprises:

storing a previous value received by said output buffer;

comparing said previous value to a present value to determine whether said transition has occurred; and comparing a voltage level on said output with a threshold voltage at a time point after a delay elapses in relation to a clock signal used to control said output buffer.

6. The method of claim 5, wherein said threshold voltage comprises a high voltage level when measuring said rate with reference to transition from logical 0 to logical 1, and a low voltage level when measuring said rate with reference to transition from logical 1 to 0.

7. An integrated circuit comprising:

an output buffer to receive an input transition on an input path and to generate an output transition on an output path in response, said output buffer driving a load coupled to said output path; and a strength controller determining a rate at which said output transition changes on said output path, and changing a strength of said output buffer until said rate equals a desired rate in response to receiving additional transitions on said input path.

8. The integrated circuit of claim 7, wherein said output transition comprises either from logical 0 to logical 1 or from logical 1 to logical 0.

9. An integrated circuit comprising:

an output buffer to receive an input transition on an input path and to generate an output transition on an output path in response, said output buffer driving a load coupled to said output path; and a strenght controller determining a rate at which said output transition changes on said output path, and changing a strenght of said output buffer until said rate equals a desired rate in response to receiving additional transitions on said input path, wherein said output buffer comprises a plurality of inverters connected in parallel, wherein each of said plurality of inverters comprises a PMOS transistor and a NMOS transistor, said each of said plurality of inverters further comprising:

a first switch between a source terminal and a gate terminal of said PMOS transistor;

a second switch between said input path and said gate terminal of said PMOS transistor;

a third switch between a source terminal and a gate terminal of said NMOS transistor; and a fourth switch between said input path and said gate terminal of said NMOS transistor.

10. The integrated circuit of claim 9, wherein said strength controller comprises a control block enabling a first set of PMOS transistors by controlling corresponding ones of said first switch to achieve said desired rate when said output transition is from logical 0 to logical 1, wherein said first set of PMOS transistors are comprised in said plurality of inverters;

said control block further enabling a first set of NMOS transistors by controlling corresponding ones of said third switch to achieve said desired rate when said output transition is from logical 1 to logical 0, wherein said first set of NMOS transistors being comprised in said plurality of inverters, wherein enabling said first set of PMOS transistors and said first set of NMOS transistors causes a W/L to be controlled to achieve said desired rate with respect to both of said logical 1 to logical 0, and said logical 0 to logical 1 transitions.

11. An integrated circuit comprising:

an output buffer to receive an input transition on an input path and to generate an output transition on an output path in response, said output buffer driving a load coupled to said output path; and a strenght controller determining a rate at which said output transition changes on said output path, and changing a strenght of said output buffer until said rate equals a desired rate in response to receiving additional transitions on said input path, wherein said output buffer comprises a PMOS transistor and a NMOS transistor, wherein said strength controller comprises a control block modifying a $V_{GS}$ voltage associated with said PMOS transistor to control said desired rate with respect to transition from logical 0 to logical 1, and modifying a $V_{GS}$ voltage associated with said NMOS transistor to control said desired rate with respect to transition from logical 1 to logical 0.

12. An integrated circuit comprising:

an output buffer to receive an input transition on an input path and to generate an output transition on an output path in response, said output buffer driving a load coupled to said output path; and a strenght controller determining a rate at which said output transition changes on said output path, and changing a strenght of said output buffer until said rate equals a desired rate in response to receiving additional transitions on said input path, wherein said strength controller storing a previous value received by said output buffer and compares said previous value to a present value to determine whether said input transition has occurred, said strength controller comparing a voltage level on said output path with a threshold voltage at a time point after a delay elapses in relation to a clock signal used to control said output buffer.

13. The integrated circuit of claim 12, wherein said threshold voltage comprises a high voltage level when measuring said rate with reference to transition from logical 0 to logical 1, and a low voltage level when measuring said rate with reference to transition from logical 1 to 0.

14. An apparatus for adjusting a strength of an output buffer driving a load, said apparatus comprising:

means for determining a rate at which an output of said output buffer changes in response to receiving a transition on an input of said output buffer; and means for changing said strength of said output buffer until said rate equals a desired rate in response to receiving additional transitions on said input.

15. The apparatus of claim 14, wherein said transition comprises either from logical 0 to logical 1 or from logical 1 to logical 0.

16. An apparatus for adjusting a strenght of an output buffer driving a load, said apparatus comprising:

means for determining a rate at which an output of said output buffer changes in response to receiving a transition on an input of said output buffer; and means for changing said strength of said output buffer until said rate equals a desired rate in response to receiving additional transitions on said input, wherein said output buffer comprises a plurality of inverters connected in parallel, wherein each of said plurality of inverters comprises a PMOS transistor and a NMOS transistor, wherein said means for changing comprises:

means for determining a first set of PMOS transistors which are to be enabled to achieve said desired rate when said transition is from logical 0 to logical 1, wherein said first set of PMOS transistors being comprised in said plurality of inverters;

means for determining a first set of NMOS transistors which are to be enabled to achieve said desired rate when said transition is from logical 1 to logical 0, wherein said first set of NMOS transistors being comprised in said plurality of inverters; and means for enabling said first set of PMOS transistors and said first set of NMOS transistors, wherein said means for enabling causes a W/L to be controlled to achieve said desired rate with respect to both of said logical 1 to logical 0, and logical 0 to logical 1 transitions.

17. An apparatus for adjusting a strenght of an output buffer driving a load, said apparatus comprising:

means for determining a rate at which an output of said output buffer changes in response to receiving a transition on an input of said output buffer; and means for changing said strenght of said output buffer until said rate equals a desired rate in response to receiving additional transitions on said input, wherein said output buffer comprises a PMOS transistor and a NMOS transistor, wherein said means for changing comprises:

means for modifying a $V_{GS}$ voltage associated with said PMOS transistor to control said desired rate with respect to said transition from logical 0 to logical 1; and means for modifying a $V_{GS}$ voltage associated with said NMOS transistor to control said desired rate with respect to said transition from logical 1 to logical 0.

18. An apparatus for adjusting a strength of an output buffer driving a load, said apparatus comprising:

means for determining a rate at which an output of said output buffer changes in response to receiving a transition on an input of said output buffer; and means for changing said strength of said output buffer until said rate equals a desired rate in response to receiving additional transitions on said input, wherein said means for determining comprises:

means for storing a previous value received by said output buffer;

means for comparing said previous value to a present value to determine whether said transition has occurred; and means for comparing a voltage level on said output with a threshold voltage at a time point after a delay elapses in relation to a clock signal used to control said output buffer.

19. The apparatus of claim 18, wherein said threshold voltage comprises a high voltage level when measuring said rate with reference to transition from logical 0 to logical 1, and a low voltage level when measuring said rate with reference to transition from logical 1 to 0.

20. A device comprising:

a data source providing a sequence of digital values;

an output buffer coupled to said data source to receive said sequence of digital values on an input path, said sequence of digital values including an input transition, said output buffer generating an output transition on an output path in response to said input transition, said output buffer driving a load coupled to said output path; and a strength controller determining a rate at which said output transition changes on said output path, and changing a strength of said output buffer until said rate equals a desired rate in response to receiving additional transitions on said input path, said additional transitions also being contained in said sequence of digital values.

21. The device of claim 20, wherein said output transition comprises either from logical 0 to logical 1 or from logical 1 to logical 0.

22. A device comprising:

a data source providing a sequence of digital values;

an output buffer coupled to said data source to receive said sequence of digital values on an input path, said sequence of digital values including an input transition, said output buffer generating an output transition on an output path in response to said input transition, said output buffer driving a load coupled to said output path; and a strenght controller determining a rate at which said output transition changes on said output path, and changing a strength of said output buffer until said rate equals a desired rate in response to receiving additional transitions on said input path, said additional transitions also being contained in said sequence of digital values, wherein said output buffer comprises a plurality of inverters, connected in parallel, wherein each of said plurality of inverters comprises a PMOS transistor and a NMOS transistor, said each of said plurality of inverters further comprising:

a first switch between a source terminal and a gate terminal of said PMOS transistor;

a second switch between said input path and said gate terminal of said PMOS transistor;

a third switch between a source terminal and, a gate terminal of said NMOS transistor; and a fourth switch between said input path and said gate terminal of said NMOS transistor.

23. The device of claim 22, wherein said strength controller comprises a control block enabling a first set of PMOS transistors by controlling corresponding ones of said first switch to achieve said desired rate when said output transition is from logical 0 to logical 1, wherein said first set of PMOS transistors are comprised in said plurality of inverters;

said control block further enabling a first set of NMOS transistors by controlling corresponding ones of said third switch to achieve said desired rate when said output transition is from logical 1 to logical 0, wherein said first set of NMOS transistors being comprised in said plurality of inverters, wherein enabling said first set of PMOS transistors and said first set of NMOS transistors causes a W/L to be controlled to achieve said desired rate with respect to both of said logical 1 to logical 0, and said logical 0 to logical 1 transitions.

24. A device comprising:

a data source providing a sequence of digital values;

an output buffer coupled to said data source to receive said sequence or digital values on an input path, said sequence of digital values including an input transition, said output buffer generating an output transition on an output path in response to said input transition, said output buffer driving a load coupled to said output path; and a strenght controller determining a rate at which said output transition changes on said output path, and changing a strength of said output buffer until said rate equals a desired rate in response to receiving additional transitions on said input path, said additional transitions also being contained in said sequence of digital values, wherein said output buffer comprises a PMOS transistor and a NMOS transistor, wherein said strength controller comprises a control block modifying a $V_{GS}$ voltage associated with said PMOS transistor to control said desired rate with respect to transition from logical 0 to logical 1, and modifying a $V_{GS}$ voltage associated with said NMOS transistor to control said desired rate with respect to transition from logical 1 to logical 0.

25. The device of claim 21, wherein said strength controller storing a previous value received by said output buffer from said data source and compares said previous value to a present value to determine whether said input transition has occurred, said strength controller comparing a voltage level on said output path with a threshold voltage at a time point after a delay elapses in relation to a clock signal used to control said output buffer.

26. The device of claim 25, wherein said threshold voltage comprises a high voltage level when measuring said rate with reference to transition from logical 0 to logical 1, and a low voltage level when measuring said rate with reference to transition from logical 1 to 0.

27. The device of claim 26, further comprising:

a tens through which a light from an image is passed;

a charge coupled device (CCD) generating a plurality of voltage values in response to incidence of said light;

an analog front end (AFE) converting said plurality of voltage values to generate said sequence of digital values, wherein said AFE comprises said data source; and said load coupled to said output path comprises one of a computer system, a floppy disk, a printer and a video player.

28. The invention of claim 27, wherein said device comprises a digital camera or a scanner.

* * * * *